(12) United States Patent
Scotch et al.

(10) Patent No.: US 8,071,997 B2
(45) Date of Patent: Dec. 6, 2011

(54) LED WITH LIGHT TRANSMISSIVE HEAT SINK

(75) Inventors: Adam M. Scotch, Amesbury, MA (US); George C. Wei, Weston, MA (US)

(73) Assignee: OSRAM SYLVANIA Inc., Danvers, MA (US)

( * ) Notice: Subject to any disclaimer, the term of this patent is extended or adjusted under 35 U.S.C. 154(b) by 0 days.

(21) Appl. No.: 11/543,863

(22) Filed: Oct. 6, 2006

(65) Prior Publication Data

US 2007/0080362 A1    Apr. 12, 2007

Related U.S. Application Data

(60) Provisional application No. 60/725,107, filed on Oct. 7, 2005.

(51) Int. Cl.
    *H01L 23/36*    (2006.01)
(52) U.S. Cl. .................. 257/99; 257/707; 257/E33.058
(58) Field of Classification Search .................. 257/99, 257/707, E33.058
    See application file for complete search history.

(56) References Cited

U.S. PATENT DOCUMENTS

| | | | |
|---|---|---|---|
| 3,941,719 A | 3/1976 | Yoldas | |
| 3,944,658 A | 3/1976 | Yoldas | |
| 5,892,986 A * | 4/1999 | Sato et al. | 396/30 |
| 6,025,213 A * | 2/2000 | Nemoto et al. | 438/122 |
| 6,150,668 A | 11/2000 | Bao et al. | |
| 6,597,713 B2 * | 7/2003 | Ouchi | 372/36 |
| 6,636,539 B2 * | 10/2003 | Martinsen | 372/36 |
| 6,711,189 B1 * | 3/2004 | Gilliland et al. | 372/38.02 |
| 6,720,830 B2 * | 4/2004 | Andreou et al. | 330/253 |
| 6,869,812 B1 | 3/2005 | Liu | |
| 6,949,771 B2 | 9/2005 | Yoganandan et al. | |
| 2004/0145308 A1 | 7/2004 | Rossner et al. | |
| 2004/0164307 A1 | 8/2004 | Mueller-Mach et al. | |
| 2005/0057701 A1 * | 3/2005 | Weiss | 349/10 |
| 2005/0218420 A1 * | 10/2005 | Bessho et al. | 257/99 |
| 2005/0269582 A1 | 12/2005 | Mueller et al. | |
| 2006/0187653 A1 | 8/2006 | Olsson | |

FOREIGN PATENT DOCUMENTS

| | | |
|---|---|---|
| EP | 1580594 A2 | 9/2005 |
| JP | 8018105 A | 1/1996 |
| JP | 2005-077505 A | 3/2005 |
| WO | 2001/41225 A2 | 6/2001 |

OTHER PUBLICATIONS

Yoldas, "Alumina Sol Preparation from Alkoxides," vol. 54, No. 3 Ceramic Bulletin 289-290 (1975).
Yoldas, "A Transparent Porous Alumina ," vol. 54, No. 3 Ceramic Bulletin 286-288 (1975).
Partial translation of JP Patent Appl. Publication No. 2005-77505, published Mar. 24, 2005, Application No. 2003-304909, filed Aug. 28, 2003 (2 pages).

* cited by examiner

*Primary Examiner* — Wensing Kuo
(74) *Attorney, Agent, or Firm* — Edward S. Podszus

(57) ABSTRACT

An more efficient or higher luminance LED assembly may be formed from a high power LED chip having a first surface, and a second surface, the first surface being mounted to a substrate; the second surface being in intimate thermal contact with a light transmissive heat sink having a thermal conductivity greater than 30 watts per meter-Kelvin. The LED chip is otherwise in electrical contact with at least a first electrical connection and a second electrical connection for powering the LED chip. Providing light transmissive heat sink can double the heat conduction from the LED dies thereby increasing life, or efficiency or luminance or a balance of the three.

52 Claims, 7 Drawing Sheets

LED WITH LIGHT TRANSMISSIVE HEAT SINK

CROSS-REFERENCE TO RELATED APPLICATIONS

The Applicants hereby claim the benefit of their provisional application, Ser. No. 60/725,107 filed Oct. 7, 2005 for LED WITH LIGHT TRANSMISSIVE HEAT SINK.

BACKGROUND OF THE INVENTION

1. Field of the Invention

The invention relates to LED solid-state light sources and particularly to LEDs. More particularly the invention is concerned with an LED having an optically transmissive heat sink.

2. Description of the Related Art Including Information Disclosed Under 37 CFR 1.97 and 1.98

Light emitting diodes (LEDs) generate light when a current is applied to the device. However, not all of the power input into the device is converted to light. There is a large portion of energy that is given off as heat. As the semiconductor material heats up, like most electronics devices, the LED performance is degraded. This can cause decreased light output (flux), a color shift, and a reduction in device lifetime. Consequently, there is a need to efficiently remove heat from the LED chip during operation without significantly reducing light output from the package.

In most conventional electronics packages, those not emitting light, the active semiconductor chip is placed between two electrically conducting plates made of a material with a high thermal conductivity, such as copper. These plates serve as heat spreaders and effectively remove the heat from both the top and bottom surfaces of the chip. The thermal energy generated by the semiconductor chip is further dissipated by heat sinks attached to the electric plates and transported away from the chip and out of the system. Unlike semiconductor chips for power electronics, LEDs generate light, which must be extracted from the package. The opaque materials such as copper or other metal heat sinks block the light-emitting surface of the LED. Consequently, LED packages are typically only able to extract heat from one side of the chip, thereby eliminating half of the effective surface area for heat dissipation.

The present invention uses thermally conductive light transmissive materials to allow for heat dissipation on all sides of the LED without blocking the emitted light. The benefits of a heat conductive lens include: (1) a reduction in the operating temperature of LEDs, yielding increased efficiency of the LED, stable colors with little wavelength shift, and longer life; (2) increased thermal dissipation enabling the LEDs to be driven at higher currents and higher input power, yielding more light flux without overheating the LED die; and (3) the potential for adding many more heat producing devices in close proximity to the LED die, including other LED dies and integrated electronics such as resistors, capacitors, and transformers.

The use of a heat conductive lens applies to light emitting diodes (LED), ultra-violet (UV) emitting LEDs, and infrared (IR) emitting LEDs. The invention may also be used for laser diodes and any other light producing device that requires stable temperatures for operation.

BRIEF SUMMARY OF THE INVENTION

An LED assembly with improved heat sinking may be constructed with a high power LED chip having a first surface, and a second surface, the first surface being mounted to a substrate; the second surface being in intimate thermal contact with a light transmissive heat sink having a thermal conductivity greater than 30 watts per meter-Kelvin. The LED chip is otherwise in electrical contact with at least a first electrical connection and a second electrical connection for powering the LED chip.

DETAILED DESCRIPTION OF THE INVENTION

Figure 1:
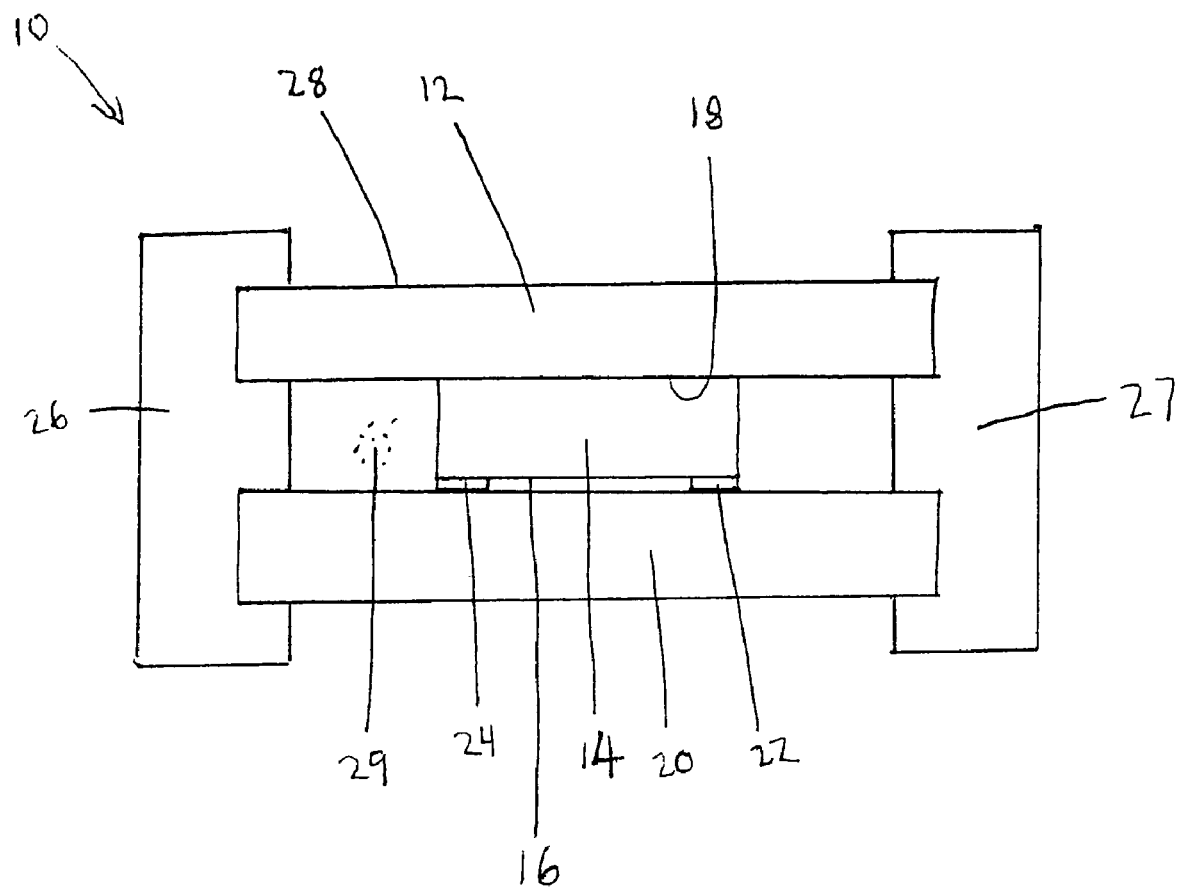
FIG. 1 shows a schematic cross section of an LED assembly with a light transmissive heat sink.

FIG. 1 shows schematic cross section of an LED assembly 10 with a light transmissive heat sink 12. The LED assembly 10 comprises a high power LED chip 14 having a first surface 16, and a second surface 18. The first surface 16 is mounted to a substrate 20. The second surface 18 is in intimate thermal contact with the light transmissive heat sink 12. The light transmissive heat sink 12 has a thermal conductivity greater than 30 watts per meter-Kelvin. The LED chip 14 is otherwise in electrical contact with at least a first electrical connection 22 and a second electrical connection 24 for powering the LED chip 14.

The LED chip 14 may be any high power LED chip 14. A high power LED chip 14 as used here means an LED chip with a power density of 1 watt per square millimeter or greater. It is understood that term "LED chip" as used here may be formed from a single die or a plurality of dies closely grouped to meet the power density requirement. The singular term "LED chip" used herein is then meant to include arrays of individual LED chips concentrated to provide in total 1 watt per square millimeter of array area or greater. It is also understood that the term "LED chip" is meant to encompass both uncoated dies and phosphor coated dies where the phosphor coating does not interfere with the electrical coupling to the LED die. Chip level light conversion by a phosphor sandwiched between a die and a light transmissive heat sink is fully possible while the heat sinking process occurs. The preferred LED chip 14 is a thin film surface emitter. For example, a gallium nitride thin film surface emitter for blue or green light, or combined with an appropriate phosphor for white light is preferred. Gallium arsenide is preferred for infrared light and gallium phosphide is preferred for red and yellow light. The light emitted from the LED chip 14 may be infrared, visible or ultraviolet light.

The LED chip 14 has a first surface 16 mounted to a substrate 20. The substrate 20 may be any of the commonly used substrates, including but not limited to printed circuit boards, metal core circuit boards, ceramic substrates, copper or aluminum substrates, and others. The LED chip 14 may be mounted to the substrate 20 by an appropriate interfacing material (not shown). Solder and high temperature glues and epoxies are known for mounting an LED chip to a substrate.

The substrate 20 may also support one or more electrical contacts (22, 24) for supplying power to the LED chip 14. It is common to form one or more electrical traces on a substrate 20 and mount the LED chip 14 so as to receive power from the trace or traces as the case may be. The supporting substrate commonly includes electrical connections, such as electrically conductive trace lines, mounting pads and other electrical circuitry features for supplying and possibly controlling the electric power to drive the LED chip 14. FIG. 1 shows what is known as a flip chip mounted to a substrate 20 so as to receive power through the first surface 16 by way of two trace lines (22, 24) on the substrate 20, while emitting light from the second surface 18.

The substrate 20 may be further coupled along its edge or backside to a heat sink, or support frame 26. Such heat sinks are commonly metal bodies with heat dissipating features like fins, pins, heat pipes and similar heat ducting and dispersing structures. Alternatively, a ceramic frame 27 may be used.

The second surface 18 of the LED chip 14 is positioned to be in intimate thermal contact with a light transmissive heat sink 12. As used here, light transmissive means having a high light transmittance, meaning a transmittance of 80 percent or more of the theoretical total transmittance of the material. It is understood that light transmissive encompasses transparent, where transparent means an in-line transmittance of 50 percent or more of theoretical in-line light transmission. It also includes translucency, where translucency means an in-line transmittance of 3 percent or more of theoretical in-line transmittance, plus a total transmittance of 80 percent or more of the theoretical total transmittance of the material. The light transmissive heat sink 12 then acts as a window to pass, light emitted by the LED chip 14 to a field to be illuminated. It is important that the light transmissive heat sink 12 be highly transmissive, and preferably light transparent. It is also important that the light transmissive heat sink 12 have a high thermal conductivity. High thermal conductivity as used herein means a thermal conductivity greater than 30 watts per meter-Kelvin. Windows such as those made of glass or plastic low have thermal conductivities of 1.0 watt per meter-Kelvin or less and therefore effectively function as thermal insulators. Having a thermal conductivity greater than 30 watts per meter-Kelvin means the window can act as a potent thermal drain relative to the LED chip.

To be effective, the light transmissive heat sink 12 must be intimately in contact with the LED chip 14, for example by direct contact with the LED chip 14 (via the die or via the phosphor coating as the case may be), or by a thin interfacing layer. When direct contact is made, it is preferred that 50 percent or more of the LED chip 14 contact the light transmissive heat sink 12. Alternatively, a thin (less than 15 micrometers thick) interfacing layer (not shown) may be used, for example a clear silicone based resin as used in the art may be used when no electrical contact is necessary through the light transmissive heat sink 12, as is the case in FIG. 1. An epoxy impregnated with a powder from the light transmissive heat sink materials, or a powder of indium tin oxide may be used.

There are a number of preferred light transmissive ceramics that have thermal conductivities of 30 watts per meter-Kelvin or more. These include aluminum nitride (AlN) (200 W/mK), including regular grained AlN (15-30 micrometer grains), submicron-grained AlN or nano-grained AlN; alumina ($Al_2O_3$) (30 W/mK), submicron alumina (30 W/mK), or nanograined alumina (30 W/mK); or magnesium oxide (MgO) (59 W/mK). Each of these materials has advantages and disadvantages. Some of the light transmissive heat sink materials are also highly transmissive in the infrared range from 3 to 5 microns, which happens to be the approximate peak radiation point of the usual LED chip temperature operating range of 300 K to 400 K. The better JR transmitters include aluminum nitride (AlN), alumina ($Al_2O_3$), and magnesium oxide (MgO). Spinel, AlON, YAG, and yttria are also transparent in the 3 to 5 micron range. Other ceramics such as spinel, AlON, YAG and Yttria are transparent in the visible, but have low thermal conductivity (<30 W/mK) and therefore are not as desirable as aluminum nitride (AlN), alumina ($Al_2O_3$), and magnesium oxide (MgO). Also, some materials such as YAG are not very transmissive (80% or less) in the JR range from 3 to 5 microns. The light transmissive heat sink then adds an additional cooling mechanism by radiating heat from the junction, which is absent in the case of a plastic or glass, lens or window. The preferred light transmissive heat sink materials are therefore good at further reducing self-heating by allowing enhanced JR radiation, and in particular have a transmission greater than 80 percent in the JR region of from 3 to 5 microns. Other materials have lower indexes of refraction than the associated dies have, and thereby encourage light extraction from the LED die. The Applicants prefer aluminum nitride for thermal conductivity and for a thermal coefficient of expansion well matched to that of many LED chips. Nano-grained or submicron grained alumina is preferred for thermal conductivity and for transparency. Alumina in differing forms is preferred for manufacturing cost. Magnesium oxide is preferred for optical transmission and for a low refractive index.

The light transmissive heat sink 12 may be a planar window, preferably with an area substantially greater than the area of the LED chip's second surface 18. Substantially greater means four or more times greater in area. A heat sink with twice the linear dimension starts to act as a good heat sink, spreading the heat over four times the area. The surrounding edge of the light transmissive heat sink then acts as a heat dissipater. Additional active or passive heat dissipating features can be added along the edge of the light transmissive heat sink 12, such as a metal frame 26, and heat dissipating features (walls, fins, holes and the like) that extend or spread the ceramic material's surface area. The preferred frame 26 is peripherally joined to the substrate 20 for heat conduction into the substrate 20. The frame 26 may be tightly coupled to the light transmissive heat sink 12 by close mechanical contact or by glue, silicone, brazing, frit or another appropriate interfacing material (not shown) that bonds and conducts heat well as a thin layer.

The preferred light transmissive heat sink 12 may extend substantially beyond the edge of the LED chip 14 as a radial flange 28. All of the surrounding flange area then acts as a heat sink 12. The relative thickness of the light transmissive heat sink 12 and the extent of the flanging area can be maximized using thermal management software given the heat flux from the LED chip 14 and the thermal conductivity of any interfacing fill material, the size and shape of the light transmissive heat sink 12 and the thermal conductivity of the light transmissive heat sink 12 material. In general the larger the area of the light transmissive heat sink 12 relative to the LED chip 14, the greater heat sinking effect. The greater the volume of the light transmissive heat sink 12 the greater the heat spreading effect. The greater the thermal conductivity of the light transmissive heat sink 12 material, the greater the heat spreading effect. Any open volume between the light transmissive heat sink 12, LED 14, substrate 20 and support frame 26 (27) (if any) may be filled with an appropriate heat conductive, and light transmissive filler such as a silicone resin 29.

Figure 2:
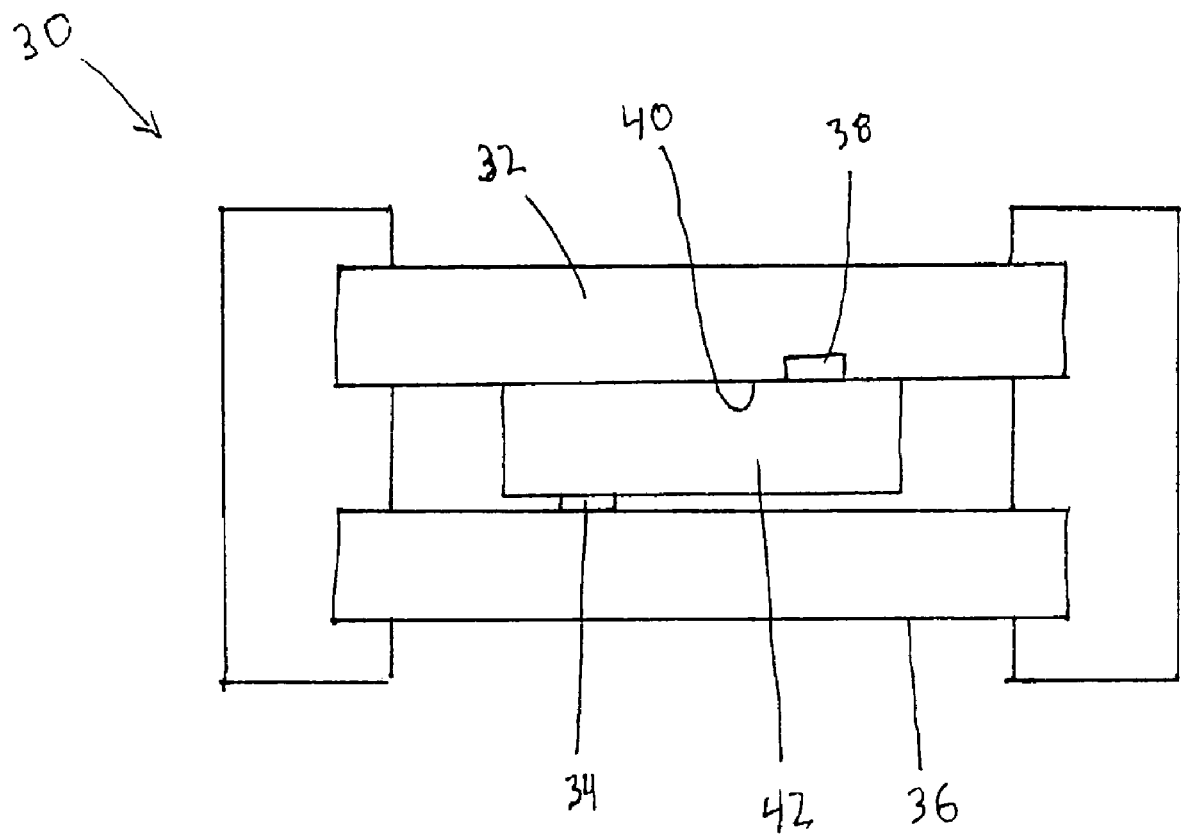
FIG. 2 shows a schematic cross section of an alternative LED assembly with a light transmissive heat sink.

FIG. 2 shows a schematic cross section of an alternative LED assembly 30 with a light transmissive heat sink 32. The light transmissive heat sink 32 may be formed to provide one of the electrical contacts of the LED chip. The first electrical contact 34 may still be supplied via the substrate 36. The second electrical contact 38 is supplied via the light transmissive heat sink 32. The second electrical contact 38 may be formed as an embedded electrical contact formed on the surface of the light transmissive heat sink 32. This may be a fine wire, deposited metal surface layer, or metal surface infusion formed on or in the light transmissive heat sink 32 to form an electrical contact with the second surface 40 of the LED chip 42. As metals are generally not light transmissive, the area of the metal contact should be minimized to maximize light transmission from the LED chip 42 through the light transmissive heat sink 32.

Figure 3:
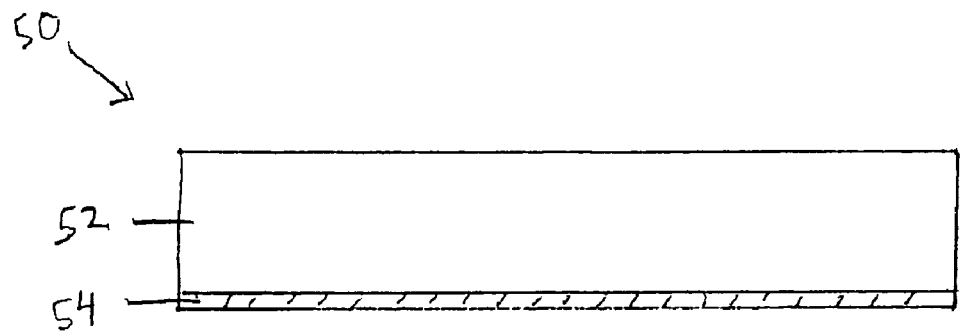
FIG. 3 shows a schematic cross section of an alternative light transmissive heat sink.

FIG. 3 shows a schematic cross section of an alternative light transmissive heat sink 50. In a further variation the light transmissive heat sink 50 may be formed in two layers. The first layer is a light transmissive ceramic 52 with a thermal conductivity of 30 watts per meter-Kelvin or more, and comprises the majority of the light transmissive heat sink 50. The second layer 54 interfaces between the LED chip and the light transmissive ceramic 52. The interfacing second layer 54 is significantly thinner so as not to resist thermal conduction from the LED chip to the light transmissive ceramic 52. The interfacing second layer 54 is formed from a light transmissive electric conductor, such as indium-tin oxide, an electrically conductive polymer, or a metal deposition sufficiently thin to be light transmissive while still electrically conductive. By electrically connecting the LED chip with an electrically conductive layer, the typical wire bond connection may be removed, enabling the light transmissive heat sink to interface directly with the LED chip for better thermal conduction.

Figure 4:
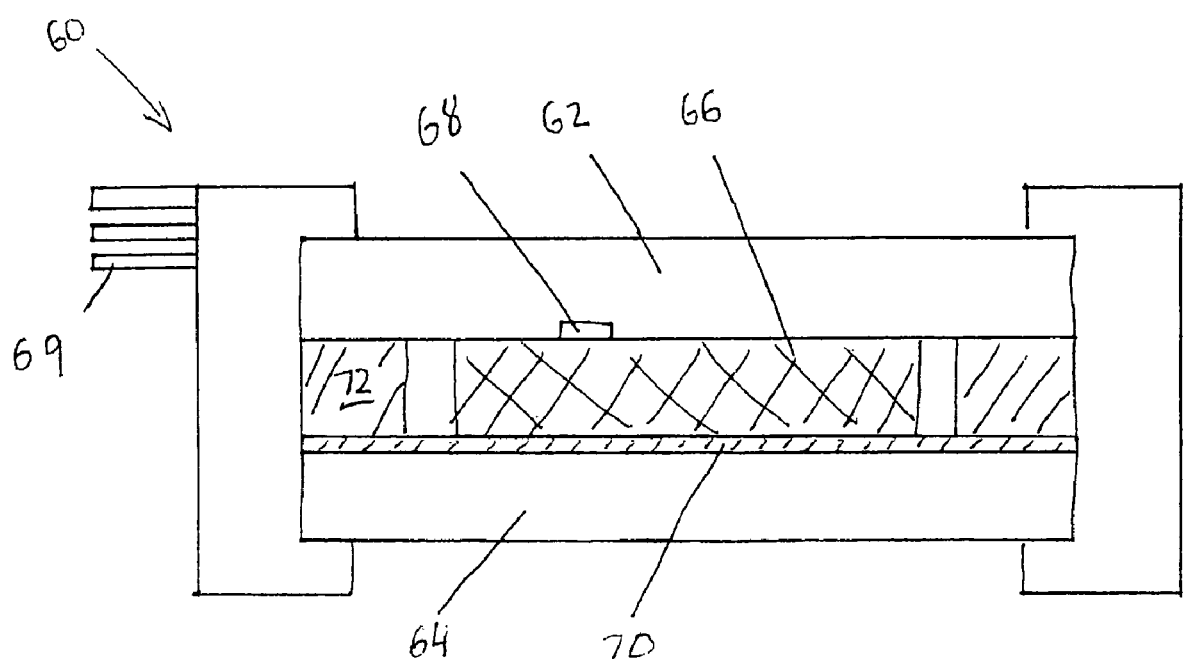
FIG. 4 shows a schematic cross section of an alternative LED assembly with a light transmissive heat sink.

FIG. 4 shows a schematic cross section of an alternative LED assembly 60 with a light transmissive heat sink 62. In the same way the light transmissive heat sink may be formed to provide one of the electrical contacts (trace, embedded electrode or conductive layer), the substrate may be replaced with a second light transmissive heat sink 64 supplying the other electrical contact. The LED chip 66 is then sandwiched between a first light transmissive heat sink 62 ("the window") supporting a first electrical contact 68 and a second light transmissive heat sink 64 ("the substrate") supporting a second electrical contact 70. The LED chip 66 is then doubly cooled through the heat sinking lens 62 and heat sinking substrate 64 while transmitting light through both. The remaining intermediate volume between the first light transmissive heat sink 62 and the second light transmissive heat sink 64 may be filled with a supporting ring 72, or a fill material such as one of the known silicone fills used in LED assemblies. Alternatively, one or both of the light transmissive heat sinks may be formed to bridge the intermediate space to contact the other light transmissive heat sink. Such a bridge satisfies both closure and heat sinking. The light transmissive heat sink 62, substrate 64 or bridging frame may be formed with heat dissipating features 69 such as fins, fingers, holes and other similar features to increase heat dissipation from the surface.

Figure 5:
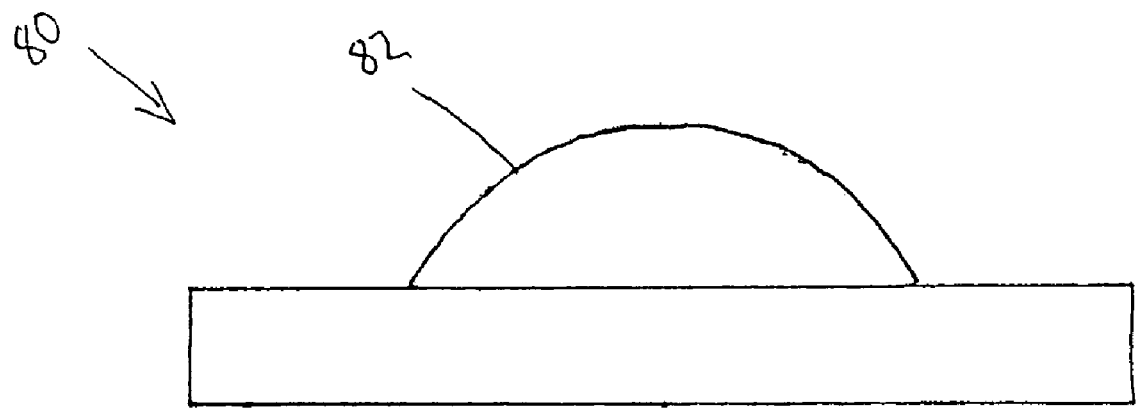
FIG. 5 shows a schematic cross section of a light transmissive heat sink with a formed refractive lens.
Figure 6:
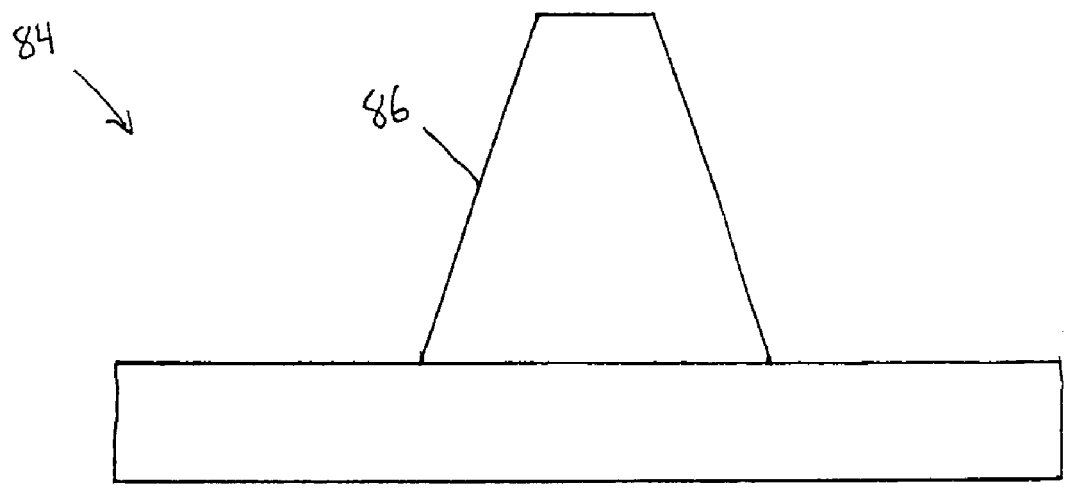
FIG. 6 shows a schematic cross section of a light transmissive heat sink with a formed light guide, such as a tapered prism.

The exterior surface of the light transmissive heat sink, the side away from the LED chip, may be formed with optical features to focus, diffuse, refract, or guide the light transmitted through the light transmissive heat sink. FIG. 5 shows a schematic cross section of a light transmissive heat sink 80 with a formed refractive lens 82. FIG. 6 shows a schematic cross section of a light transmissive heat sink 84 with a formed light guide 86, such as a tapered prism.

Figure 7:
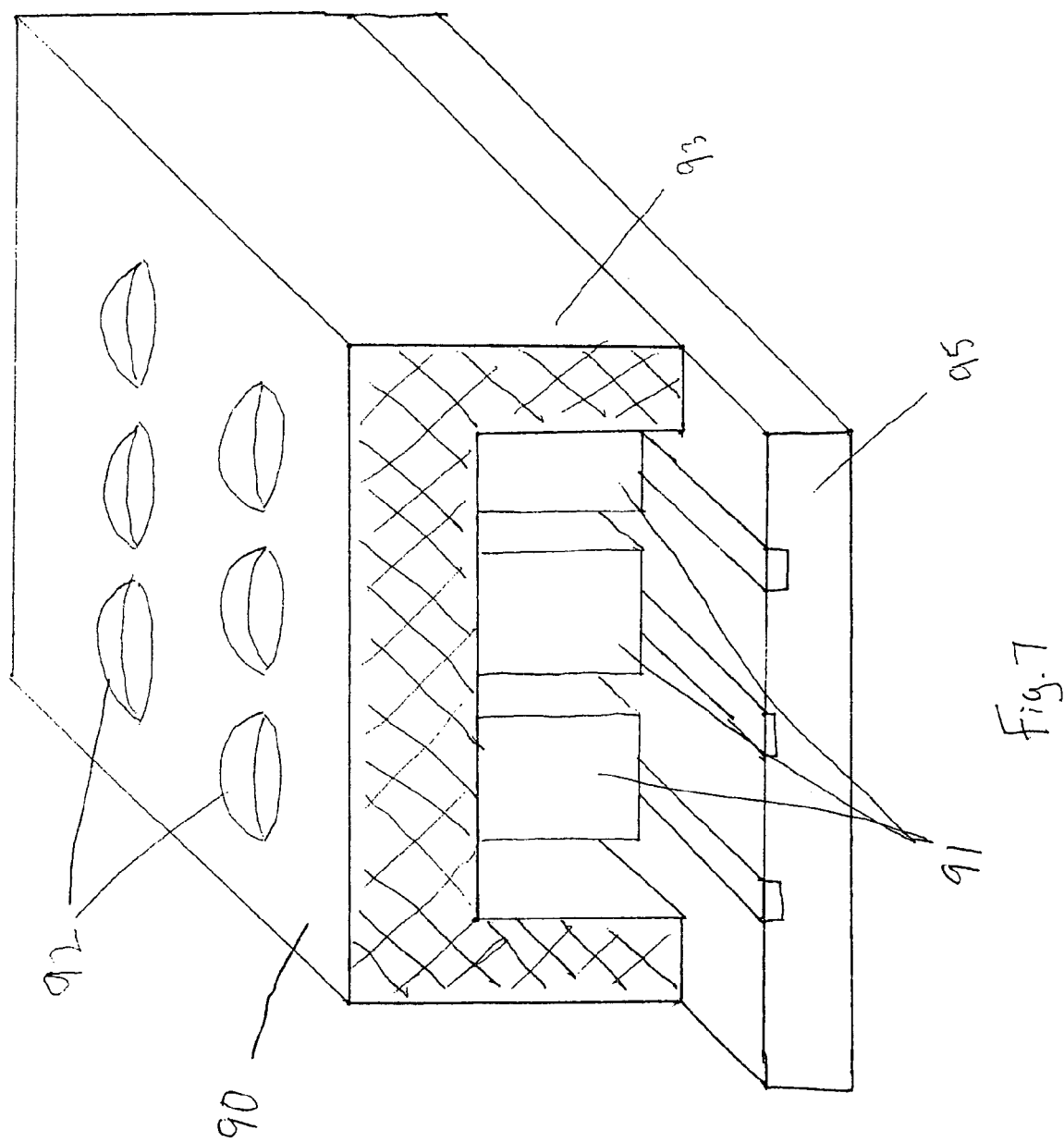
FIG. 7 shows a schematic view of a light transmissive heat sink with a grid of refractive lens features.
Figure 8:
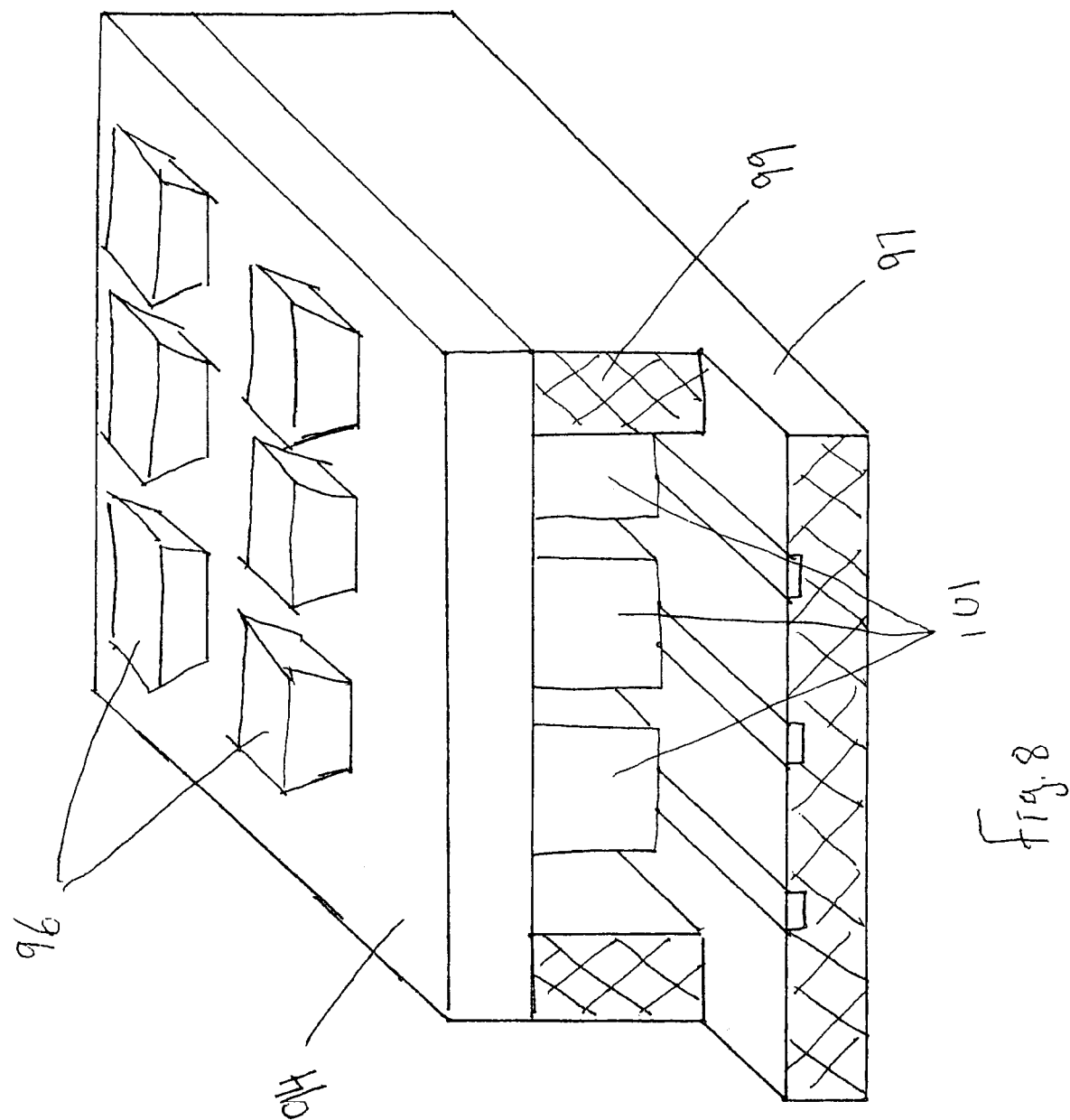
FIG. 8 shows a schematic view of a light transmissive heat sink with a grid of light guide features.

A single LED with light transmissive heat sink assembly has been described; however, an array of such assemblies may be made using a single substrate supporting an array of multiple LED chips, closed by a single light transmissive heat sink. The single cover may include a grid of lenses, or a grid of light guides. FIG. 7 shows a schematic sectional view partially cut away of a light transmissive heat sink 90 with a grid of refractive lens features 92 fed by a corresponding grid of LEDs 91. The light transmissive heat sink 90 also includes a bridging wall 93 extending around the periphery to thermally couple to the substrate 95. This is to bridge heat from the light transmissive heat sink 90 to the substrate 95. FIG. 8 shows a schematic sectional view partially cut away of a light transmissive heat sink 94 with a grid of light guide features 96 fed by a corresponding grid of LEDs 101. The substrate 97 also includes a bridging wall 99 extending around the periphery of the substrate 97 to thermally couple to the light transmissive heat sink 94. This is to bridge heat from the light transmissive heat sink 94 to the substrate 97.

Figure 9:
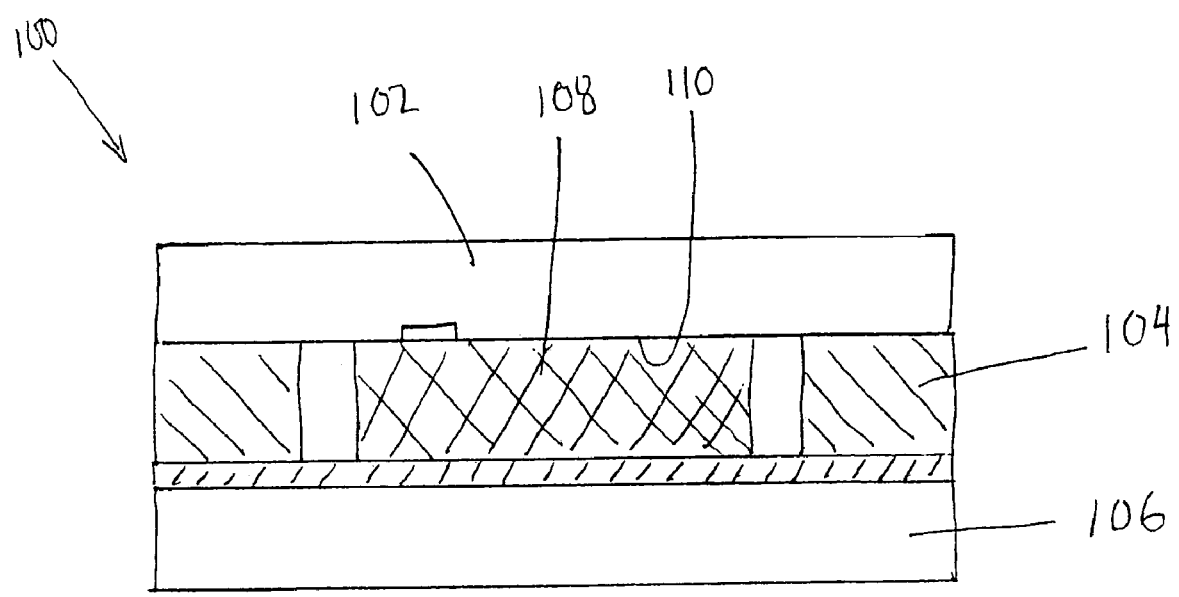
FIG. 9 shows a schematic view of a light transmissive heat sink with extended walls to mate with the substrate.

One advantage of extending the light transmissive heat sink from the LED chip is that the heat sink can be sealed hermetically. For example a hermetic frame, such as a metal frame may seal and bridge between the light transmissive heat sink and the substrate, hermetically sealing the enclosed LED chip. Sealed metal vias, as known in the art, may be used to electrically connect through the hermetic exterior shell to the interior for electrical connection. FIG. 9 shows a schematic view of an LED assembly 100 with a light transmissive heat sink 102 with extended walls 104 to mate with the substrate 106. The LED chip 108 is mounted on a (insulated) metal substrate 106. A support frame 104 surrounds the LED chip 108 while in good thermal contact with the substrate 106. The support frame 104 may be co-formed with the substrate 106, or formed as part of the light transmissive heat sink 102 or may be a separately attached piece such as an encircling ring or similar body defining an interior space to enclose the LED chip 108. The light transmissive heat sink 102 contacts the top surface of the LED chip 108 for heat input from the LED chip 108 and bridges to the support frame 104 for heat conduction away from the LED chip 108. The light transmissive heat sink 102 and substrate 106 may be soldered, brazed, epoxied, resin sealed or similarly hermetically sealed along the adjoining walls of the frame 104. An advantage of the light transmissive heat sink materials is they can be more closely matched to the coefficient of thermal expansions of the LED chip, the substrate or the bridging materials than can the commonly used glass and plastic cover materials, thereby reducing stress on the hermetic seals. In particular the optical feed from the LED chip can be fed directly via the heat sink (via for example lens 92 or guide 96), avoiding the sealing issues, and hermaticity issues with other systems. If a hermetic structure is not required, the support frame 104 can still be used as an effective thermal bridge between the light transmissive heat sink 102 and the substrate 106.

A light converting phosphor may also be used remotely with respect to the LED chip, and light transmissive heat sink. For example the light converting phosphor may be applied to the exterior surface of the light transmissive heat sink, the refractive lens feature, or the light guide feature.

Spreading the heat from the LED chip over the transmissive heat sink, depending on the area can quickly double the available heat sinking effect on the LED. If run at standard voltage, the LED chip can then be operated from 8 to 23 percent more efficiently in producing light, having a substantial effect on small lamp battery life, or in total electrical consumption in large (wall size) arrays. Alternatively, the LED chip can be run at twice the current while effectively maintaining the same chip (die) temperature. While efficiency (lumens/watt) then does not increase, the total number of emitted lumens approximately doubles. This is a significant result in directed beam optics, where source luminance is important, such as in an endoscope, headlamp or similar optical beam system.

While there have been shown and described what are at present considered to be the preferred embodiments of the invention, it will be apparent to those skilled in the art that various changes and modifications can be made herein without departing from the scope of the invention defined by the appended claims.

What is claimed is:

1. An LED assembly comprising: a high power LED chip having a first surface and a second surface, the first surface being mounted to a substrate; the second surface being in intimate thermal contact with a light transmissive heat sink having an in-line transmittance of 3 percent or more of theoretical in-line transmittance, a total transmittance of 80 percent or more of the theoretical total transmittance of the material and a thermal conductivity greater than 30 watts per meter-Kelvin during operation, the LED chip arranged to pass light to the light transmissive heat sink and the light transmissive heat sink passing light to a field to be illuminated, and the LED chip being in electrical contact with at least a first electrical connection and a second electrical connection for powering the LED chip; and
wherein the intimate thermal contact is such as to be devoid of an additional element between the LED chip second surface and the light transmissive heat sink.

2. The LED assembly in claim 1, wherein the total heat flux from the second surface of the LED chip to the light transmissive heat sink is greater than four times the total heat flux from the second surface of the LED chip to air in the absence of the light transmissive heat sink.

3. The LED assembly in claim 2, wherein the light transmissive heat sink has an in-line transmittance of 50 percent or more of theoretical in-line transmittance.

4. The LED assembly in claim 1, wherein the LED chip has a power density equal to or greater than 1.0 watt per square millimeter, and the light transmissive heat sink has a periphery formed with heat dissipating features.

5. The LED assembly in claim 1, wherein the light transmissive heat sink has a transmission greater than eighty percent (80%) in the IR region of from 3 to 5 microns.

6. The LED assembly in claim 1, having a support frame with a thermal conductivity greater than 30 watts per meter-Kelvin is in intimate thermal contact with a light transmissive heat sink.

7. The LED assembly in claim 6, wherein the support frame is formed as a part of the support substrate.

8. The LED assembly in claim 6, wherein the support substrate frame is formed as a part of the light transmissive heat sink.

9. The LED assembly in claim 1, wherein the LED chip has a power density equal to or greater than 1.0 watt per square millimeter.

10. The LED assembly in claim 1, wherein support substrate provides a first electrical connection.

11. The LED assembly in claim 10, wherein substrate provides the first electrical connection and the second electrical connection for powering the LED chip.

12. The LED assembly in claim 1, wherein the light transmissive heat sink provides the second electrical connection.

13. The LED assembly in claim 1, wherein substrate is a light transmissive heat sink having a thermal conductivity greater than 30 watts per meter-Kelvin.

14. The LED assembly in claim 1, wherein light transmissive heat sink provides the second electrical connection to power the LED.

15. The LED assembly in claim 1, wherein the light transmissive heat sink includes a first layer comprising a light transmissive ceramic and a second layer comprising a light transmissive electrical conductive layer intermediate the first layer and the second surface of the LED.

16. The LED assembly in claim 15, wherein the electrical conductive layer is an electronically conductive ceramic.

17. The LED assembly in claim 15, wherein the electrical conductive layer is an electronically conductive ITO.

18. The LED assembly in claim 15, wherein the electrical conductive layer is an electronically conductive polymer.

19. The LED assembly in claim 15, wherein the electrical conductive layer is an electronically conductive embedded metal electrode.

20. The LED assembly in claim 15, wherein the electrical conductive layer is an electronically conductive deposited metal electrode layer.

21. The LED assembly in claim 1, wherein the light transmissive heat sink is made of aluminum nitride (AlN).

22. The LED assembly in claim 21, wherein the light transmissive heat sink is made of submicron grained aluminum nitride (AlN).

23. The LED assembly in claim 1, wherein the light transmissive heat sink is made of alumina.

24. The LED assembly in claim 23, wherein the light transmissive heat sink is made of submicron alumina.

25. The LED assembly in claim 23, wherein the light transmissive heat sink is made of nano alumina.

26. The LED assembly in claim 1, wherein the light transmissive heat sink is made of MgO.

27. The LED assembly in claim 1, wherein the light transmissive heat sink is optically formed to shape the optical distribution of light received from the LED chip and transmitted through the light transmissive heat sink.

28. The LED assembly in claim 1, wherein the light transmissive heat sink includes an electrically conductive trace for supplying electric power to the LED chip.

29. The LED assembly in claim 1, wherein at least a portion of the light transmissive heat sink is abutted directly against the LED chip.

30. The LED assembly in claim 1, further including a light transmissive and thermally conductive interlayer of material positioned intermediate the LED chip and the light transmissive heat sink allowing light transmission and thermal conduction from the LED chip to the light transmissive heat sink.

31. The LED assembly in claim 30, wherein the interlayer comprises a bonding component (epoxy, silicone, high temperature glue) and an infusion of a powdered light transmissive ceramic.

32. The LED assembly in claim 30, wherein the powdered light transmissive ceramic comprises 50 percent or more of the volume of the interlayer.

33. The LED assembly in claim 30, wherein the powdered light transmissive ceramic has an average particle size from 0.01 microns to 1.0 micron.

34. The LED assembly in claim 1, wherein the light transmissive heat sink is retained in a thermally conductive peripheral frame.

35. The LED assembly in claim 1, wherein the light transmissive heat sink is glued or brazed to a thermally conductive peripheral frame.

36. The LED assembly in claim 34, wherein the peripheral frame is formed with heat radiating features.

37. The LED assembly in claim 1, wherein the light transmissive heat sink includes a surface shaped with a refractive lens.

38. The LED assembly in claim 1, wherein the LED chip is a gallium nitride thin film emitter.

39. The LED assembly in claim 1, wherein the LED chip is a gallium arsenide thin film emitter.

40. The LED assembly in claim 1, wherein the LED chip is a gallium phosphide thin film emitter.

41. The LED assembly in claim 1, wherein the intermediate material is light transmissive silicone resin.

42. The LED assembly in claim 1, wherein at least one electrical contact to the LED chip is a flat trace sandwiched between the LED chip and a portion of the light transmissive heat sink.

43. The LED assembly in claim 1, wherein the LED chip is fixed along a bottom surface of LED chip to a support substrate providing at least one electrical connection to the LED chip.

44. The LED assembly in claim 1, wherein the support substrate is formed from a light transmissive material having a thermal conductivity greater than 30 watts per meter Kelvin.

45. The LED assembly in claim 1, wherein the LED chip is hermetically sandwiched between the support substrate and the light transmissive heat sink.

46. The LED assembly in claim 1, wherein a planar array of LED chips is arranged on a support substrate, and a light transmissive light transmissive heat sink covers the array of LED chips.

47. The LED assembly in claim 1, wherein the light transmissive heat sink is hermetically sealed to the support substrate.

48. The LED assembly in claim 1, wherein the light transmissive heat sink includes a light guide portion as a tapered prism.

49. An LED assembly comprising:
an LED chip sandwiched between a light transmissive thermally heat sinking cover and a light transmissive thermally heat sinking support substrate, each of the cover and the support substrate having an in-line transmittance of 3 percent or more of theoretical in-line transmittance, a total transmittance of 80 percent or more of the theoretical total transmittance of the material and a thermal conductivity greater than 30 watts per meter-Kelvin during operation,
the LED chip having a light-emitting portion arranged to pass light to at least one of the light transmissive thermally heat sinking cover and the light transmissive heat sinking support substrate;
said at least one of the cover and the support substrate being in intimate thermal contact with the light-emitting portion of the LED chip, the intimate thermal contact being devoid of an additional element therebetween;
the cover and the support substrate being supported in a thermally conductive frame including heat dissipating features;
the frame and support substrate being mounted on a first side of a thermally insulating layer, an electronic control assembly for the LED assembly being mounted on a second side of the thermally insulating layer; and
heat dissipating features being formed adjacent the electronic control assembly.

50. The LED assembly in claim 1, wherein the LED chip emits light in a visible spectrum and the light transmissive heat sink in transmissive to visible light.

51. The LED assembly in claim 1, wherein the intimate thermal contact is such that between the LED chip second surface and the light transmissive heat sink there is an absence of a cavity.

52. The LED assembly in claim 1, wherein the light transmissive heat sink has a heat sink area at least four times as great as an area of the LED chip second surface.

* * * * *